(12) United States Patent
Hasebe

(10) Patent No.: US 8,940,097 B2
(45) Date of Patent: Jan. 27, 2015

(54) VERTICAL HEAT TREATMENT APPARATUS

(75) Inventor: Kazuhide Hasebe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 9 days.

(21) Appl. No.: 13/284,269

(22) Filed: Oct. 28, 2011

(65) Prior Publication Data

US 2012/0103256 A1    May 3, 2012

(30) Foreign Application Priority Data

Oct. 29, 2010  (JP) ................................ 2010-244452

(51) Int. Cl.
| | | |
|---|---|---|
| C23C 16/46 | (2006.01) | |
| B05C 11/00 | (2006.01) | |
| B05C 13/00 | (2006.01) | |
| C23C 16/458 | (2006.01) | |
| H01L 21/67 | (2006.01) | |
| H01L 21/673 | (2006.01) | |
| C23C 16/24 | (2006.01) | |
| C23C 16/455 | (2006.01) | |
| B05C 13/02 | (2006.01) | |

(52) U.S. Cl.
CPC ............. *C23C 16/24* (2013.01); *C23C 16/4583* (2013.01); *C23C 16/4588* (2013.01); *B05C 11/00* (2013.01); *C23C 16/45574* (2013.01); *C23C 16/45578* (2013.01); *C23C 16/4584* (2013.01); *H01L 21/67303* (2013.01); *H01L 21/67309* (2013.01); *B05C 13/02* (2013.01)
USPC ....... 118/728; 118/729; 118/724; 156/345.51

(58) Field of Classification Search
USPC .......... 118/714, 715, 719, 725, 728; 414/217, 414/938; 432/5, 9–11, 64, 241, 242, 245
See application file for complete search history.

(56) References Cited

U.S. PATENT DOCUMENTS

| | | | | |
|---|---|---|---|---|
| 6,241,822 | B1 * | 6/2001 | Ide ................................ | 118/724 |
| 7,661,544 | B2 * | 2/2010 | Herzog ....................... | 211/41.18 |
| 2006/0099805 | A1 * | 5/2006 | Fujita et al. ................... | 118/724 |

FOREIGN PATENT DOCUMENTS

JP        2002299242 A    10/2002

* cited by examiner

*Primary Examiner* — Dah-Wei D Yuan
*Assistant Examiner* — Binu Thomas
(74) *Attorney, Agent, or Firm* — Nath, Goldberg & Meyer; Jerald L. Meyer

(57) ABSTRACT

Provided is a vertical heat treatment apparatus which performs a film-forming process for substrates by supplying a film-forming gas to a plurality of substrates loaded onto a substrate supporter. The substrate supporter is rotated around an inclination axis, and the apparatus includes: a plurality of main holders which are provided at every reception position of the substrates in the substrate supporter and respectively supports the peripheries of the substrates at positions separated from each other in the circumferential direction; and first and second auxiliary holders which are located to be separated from the main holders in the circumferential direction and whose tops are lower than those of the main holders. Each substrate alternates between a position supported by the first auxiliary holder and the main holders and a position supported by the second auxiliary holder and the main holders every rotation of the substrate supporter.

3 Claims, 16 Drawing Sheets

VERTICAL HEAT TREATMENT APPARATUS

CROSS-REFERENCE TO RELATED APPLICATION

This application claims the benefit of Japanese Patent Application No. 2010-244452, filed on Oct. 29, 2010, in the Japanese Patent Office, the disclosure of which is incorporated herein in its entirety by reference.

TECHNICAL FIELD

The present disclosure relates to a vertical heat treatment apparatus which performs a film-forming process using film-forming gas fed onto a plurality of substrates loaded in the form of a shelf onto a substrate supporter.

BACKGROUND

As a kind of heat treatment apparatus which performs a film-forming process for a semiconductor wafer (hereinafter, referred to as "wafer"), there is known a vertical heat treatment apparatus which performs a film-forming process for a plurality of wafers carried in a reaction tube, with the wafers loaded onto a wafer boat which is a substrate supporter. Grooves are formed in sides of supporting columns provided between a ceiling plate and a bottom plate of the wafer boat and each wafer is horizontally supported with its periphery inserted in the grooves of the supporting columns.

Meanwhile, processes of forming a polysilicon film or a polysilicon doped with boron (B) or phosphorus (P) having a thickness of, for example, 1 μm to 2 μm, which is considerably thick from the standpoint of typical semiconductor manufacturing processes, have been studied. In addition, there has been a desire to form a silicon oxide ($SiO_2$) film, a silicon nitride (SiN) film or a carbon film having a thick thickness of, for example, 3000 Å (300 nm) or so. In need of development for the formation of such a thick film, it has been considered that the thick film is applied to a 3D memory using a multilayered stack structure represented by bit-cost scalable (BICS) flash technology, terabit cell array transistor (TCAT) technology or the like. Examples of such a stack structure may include a stack structure having twenty-four (24) layers, each including a polysilicon film having a thickness of 500 Å (50 nm) and a silicon oxide film having a thickness of 500 Å formed thereon; a stack structure having 24 layers, each including a silicon oxide film having a thickness of 500 Å and a silicon nitride film having a thickness of 500 Å formed thereon; and further a stack structure having 24 layers, each including a silicon film having a thickness of 500 Å and a silicon germanium (SiGe) film having a thickness of 500 Å formed thereon.

However, since film forming gas fed into the reaction tube goes around a contact portion between the rear side of the wafer and the grooves, if the film becomes thick, a film is formed on the contact portion. This may result in separation of the film formed on the contact portion when the wafer is drawn (lifted up) out of the wafer boat, which may generate unwanted particles. In addition, when the wafer is drawn out of the wafer boat with the film formed on the contact portion going around the rear side of the wafer, the wafer may not be horizontally loaded in a subsequent process such as lithography (exposure), which may result in misalignment due to the surface of the wafer being out-of-focus. In addition, since the wafer may be adhered to (or integrated with) the wafer boat via the film formed on the contact portion, the wafer may not be drawn out of the wafer boat after film formation.

In the prior art, there is known a technique of forming a polysilicon film, in which a boat loaded with a wafer is taken out of a reaction chamber during film formation and a film-forming process is resumed after floating the wafer from the boat. However, suspension of the film formation increases film formation time by an interval corresponding to the taking-out and re-carrying of the boat or regulation of a process atmosphere.

SUMMARY

According to one embodiment of the present disclosure, there is provided a vertical heat treatment apparatus which carries a substrate supporter holding a plurality of substrates in the form of a shelf via supporting columns into a vertical reaction tube having a heater arranged around the vertical reaction tube and performs a film forming process for the substrates. The vertical heat treatment apparatus includes: a rotation mechanism which rotates the substrate supporter around an inclination axis inclined with respect to a vertical axis; a plurality of main holders which are provided at every reception position of the substrates in the substrate supporter and supports bottom peripheries of the substrates at positions separated from each other in the circumferential direction of the substrates; and first and second auxiliary holders which are located to be separated from the main holders in the circumferential direction of the substrates and whose tops are lower than those of the plurality of main holders in a direction of the inclination axis, wherein each of the substrates on the substrate supporter alternates between a position supported by the first auxiliary holder and the main holders and a position supported by the second auxiliary holders and the main holders every rotation of the substrate by means of the rotation mechanism.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
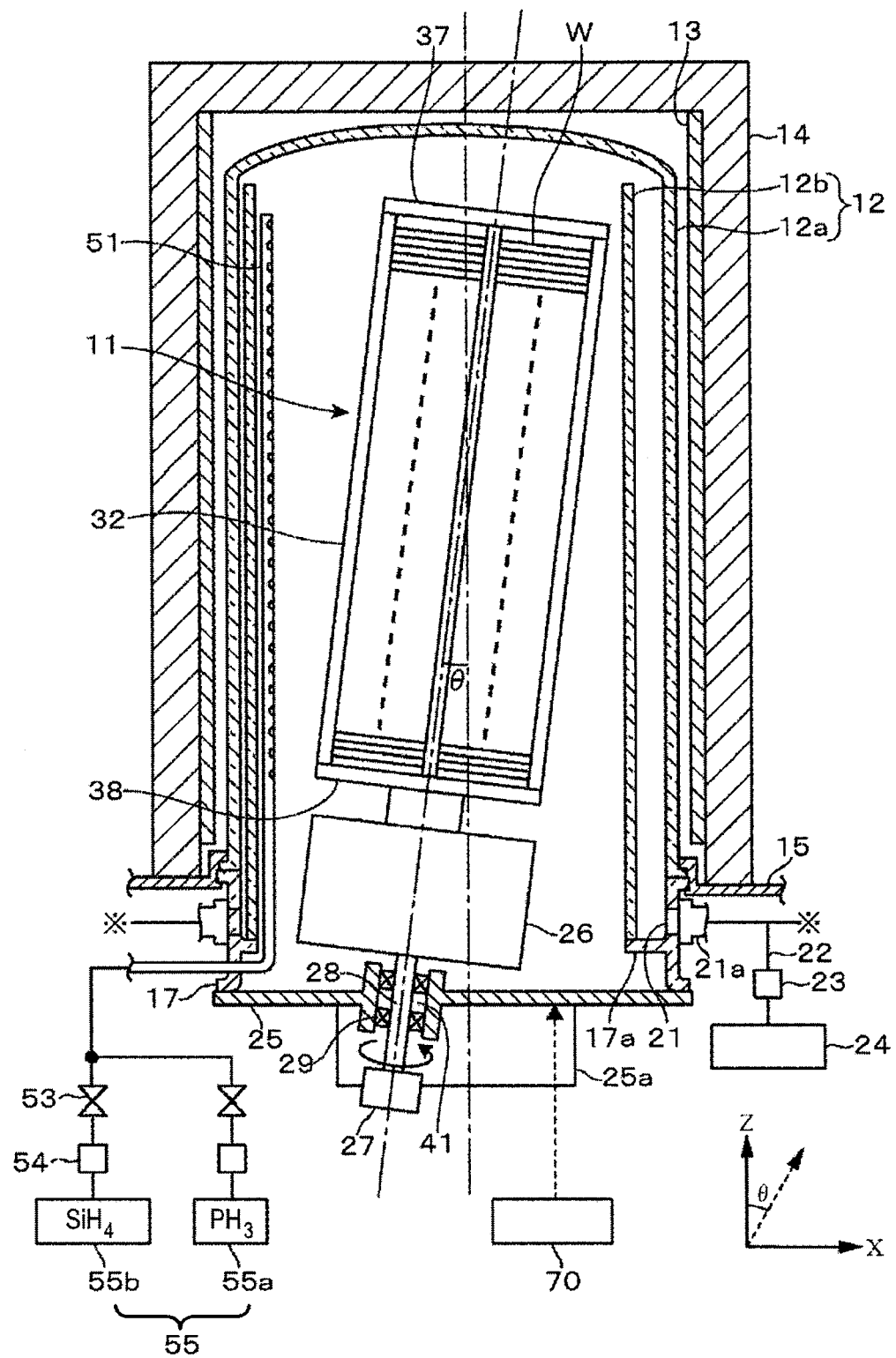
FIG. 1 is a longitudinal sectional view showing one embodiment of a vertical heat treatment apparatus of the present disclosure.

One embodiment of a vertical heat treatment apparatus of the present disclosure will be described with reference to FIGS. 1 to 6. The vertical heat treatment apparatus includes a wafer boat 11 which is a substrate supporter made of, for example, quartz, for loading wafers W having a diameter of, for example, 300 mm, in the form of a shelf, and a vertical reaction tube 12 made of, for example, quartz, for accommodating the wafer boat 11 therein and performing a film-forming process for each of the wafers W. Outside the reaction tube 12 is provided a heating furnace body 14 having a heater 13 as a heating member arranged over the circumference of the inner wall of the reaction tube. A bottom portion of the reaction tube 12 and the heating furnace body 14 is supported by a horizontally extending base plate 15 in a circumferential direction.

In this example, the reaction tube 12 has a double tube structure including an outer tube 12a and an inner tube 12b which is accommodated in the outer tube 12a. The outer tube 12a is formed in a cylindrical shape with its bottom opened and its ceiling expanding outward. The inner tube 12b is formed such that its top and bottom are opened and one side of the tube expands outward along a longitudinal direction of the inner tube 12b, and is configured such that a gas injector 51 constituting a film-forming gas feeder, which will be described later, is accommodated in the outward expanded portion. An opening in the top of the inner tube 12b forms an exhaustion hole and film-forming gas fed into the inner tube 12b is discharged to a region between the inner tube 12b and the outer tube 12a via the opening, as will be described later. The inner and outer tubes 12a and 12b are supported in an air-tight manner from the lower part of the tubes 12a and 12b by a substantially cylindrical flange unit 17 with its lower end formed in a flange shape and its top and bottom opened. That is, the outer tube 12a is supported in an air-tight manner by an upper end of the flange unit 17 and the inner tube 12b is supported in an air-tight manner by a projection 17a horizontally projecting inward from an inner wall of the flange unit 17. In FIG. 1, reference numeral 21a denotes an exhaustion port.

Figure 2:
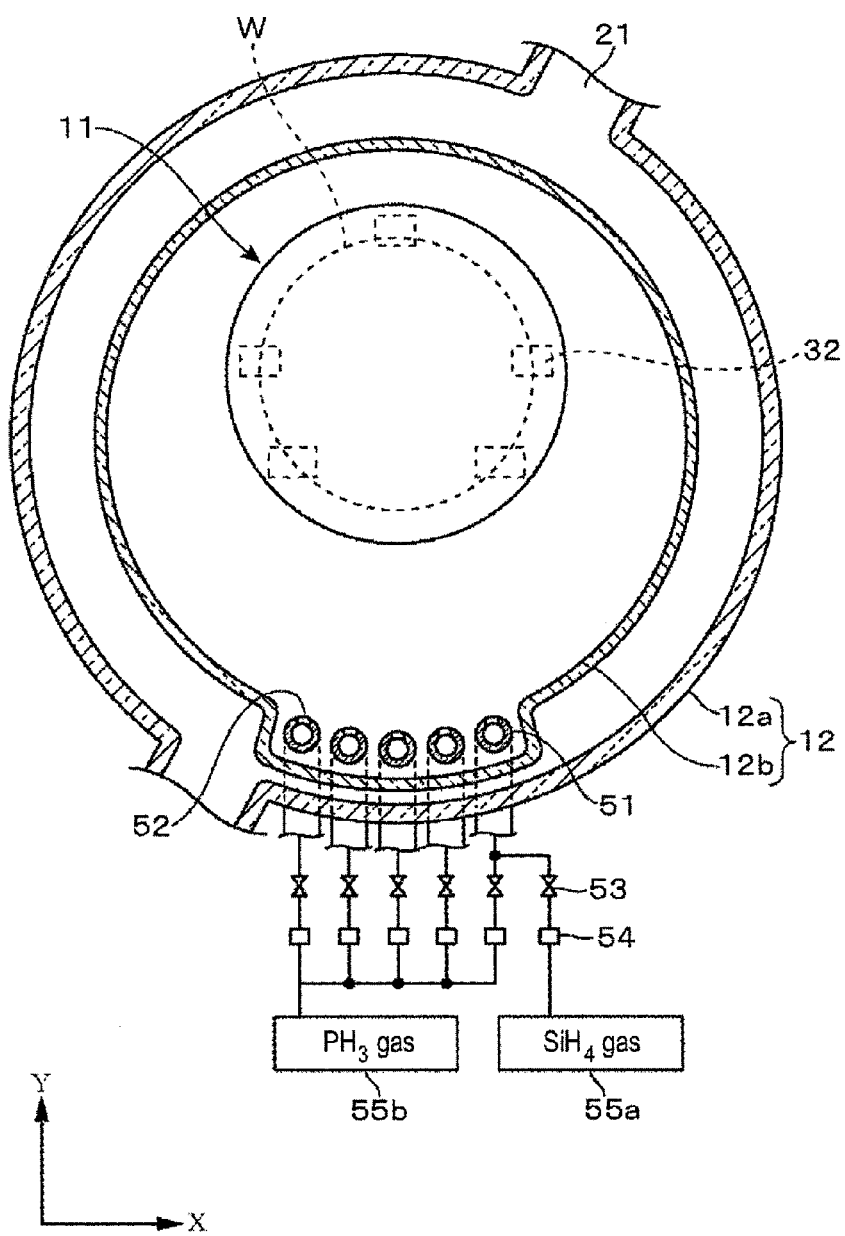
FIG. 2 is a cross-cut plan view showing the vertical heat treatment apparatus.

On a side wall of the flange unit 17 are formed, for example, two exhaustion holes 21 to communicate with a region between the outer tube 12a and the inner tube 12b, and a vacuum pump 24 is connected to an exhaustion path 22 joining and extending from the exhaustion holes 21 via a pressure regulator 23 such as a butterfly valve or the like. The exhaustion holes 21 are formed to face each other via the internal region of the reaction tube 12. That is, for example, one of the exhaustion holes 21 is formed in a region facing the gas injector 51 and the other is formed in the outside of the gas injector 51, although FIG. 2 depicts that they are laterally deviated from each other.

In the lower part of the flange unit 17 is formed a disc-like cover 25 such that its periphery makes airtight contact with the lower end of the flange unit 17 in the circumferential direction. The cover 25 is placed on an elevating station 25a constituting a part of a boat elevator which is an elevating mechanism. In the cover 25 is formed a through hole 41 which is laterally located from the center of the cover 25 and penetrates substantially vertically. A shaft 28 extending in an inclination direction inclined by, for example, 5° with respect to a vertical axis is inserted in the through hole 41 in an air-tight manner. A rotation mechanism 27, such as a motor or the like, secured to the elevating station 25a for rotating the shaft 28 around the inclination axis is connected to the lower end of the shaft 28, and the above-mentioned wafer boat 11 is connected to the upper end of the shaft 28 via a substantially cylindrical insulator 26. Accordingly, the wafer boat 11 is configured to be rotated at, for example, 0.01 to 10 rpm around the inclination axis by means of the rotation mechanism 27 during a film-forming process.

Figure 3:
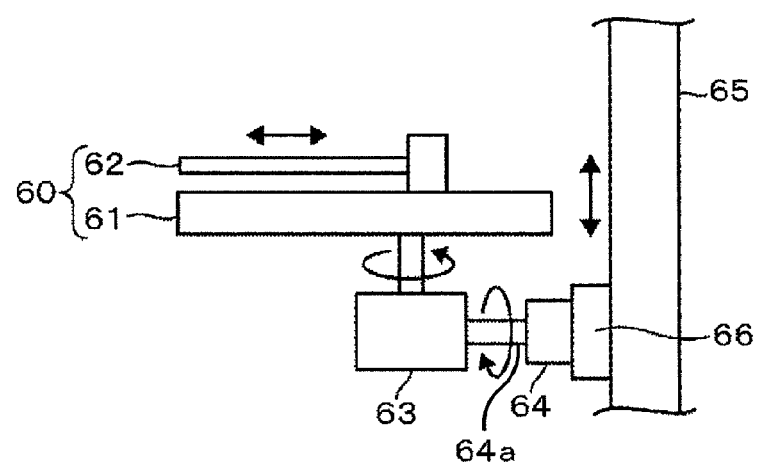
FIG. 3 is a side view showing one embodiment of a carrying arm which performs carrying-in/out a wafer in the vertical heat treatment apparatus.

In the lower part of the reaction tube 12 is provided a carrying arm 60 for carrying the wafer W in/out of the wafer boat 11. As shown in FIG. 3, the carrying arm 60 includes a plate-like base 61 and a pick 62 which is formed on the base 61 to advance and retreat relative to the wafer boat 11. The carrying arm 60 can be rotated around the vertical axis by means of a rotation mechanism 63 provided below the base 61. At the same time, the carrying arm 60 can also be rotated around a horizontal axis by means of a rocking mechanism 64 as a rotation member connected via a shaft 64a in the side of the rotation mechanism 63 such that the pick 62 is in parallel to each wafer W inclined with respect to the vertical axis in the wafer boat 11. In FIG. 3, reference numeral 65 denotes an elevation mechanism which elevates the carrying arm 60, the rotation mechanism 63 and the rocking mechanism 64 together and reference numeral 66 denotes an elevation member which elevates the rocking mechanism 64 with respect to the elevation mechanism 65. In FIG. 1, reference numeral 29 denotes a seal member such as a magnetic fluid which airtightly seals the cover 25 so that the shaft 28 can be rotated with respect to the cover 25. θ, which is schematically shown in FIG. 1, is an inclination angle of the wafer boat 11 with respect to the vertical axis.

Figure 4:
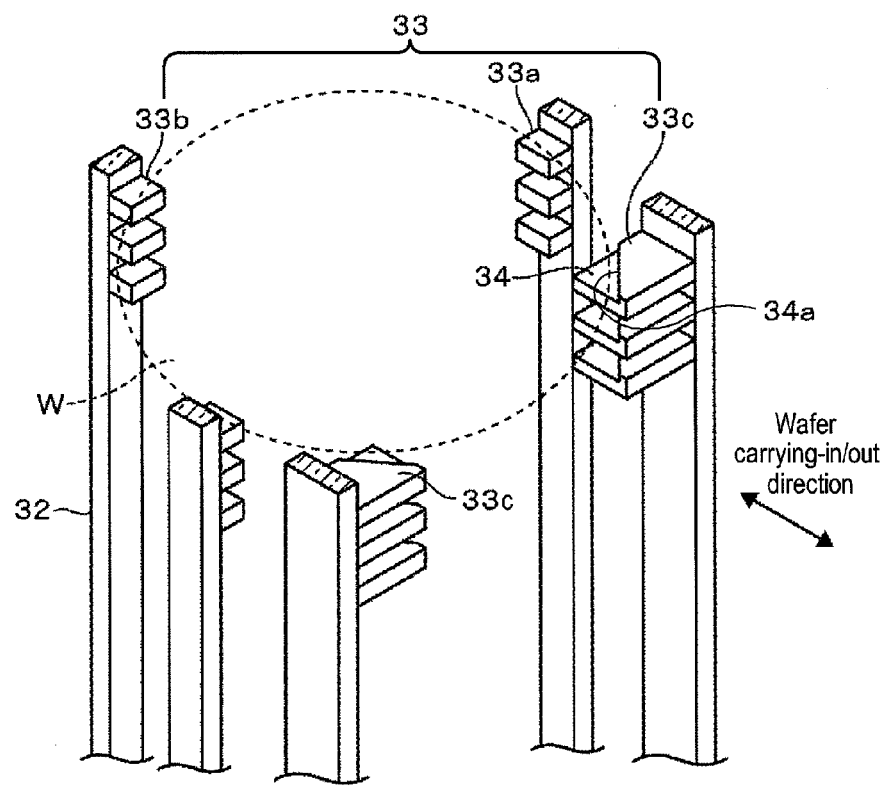
FIG. 4 is a partially-enlarged perspective view of the vertical heat treatment apparatus.
Figure 5:
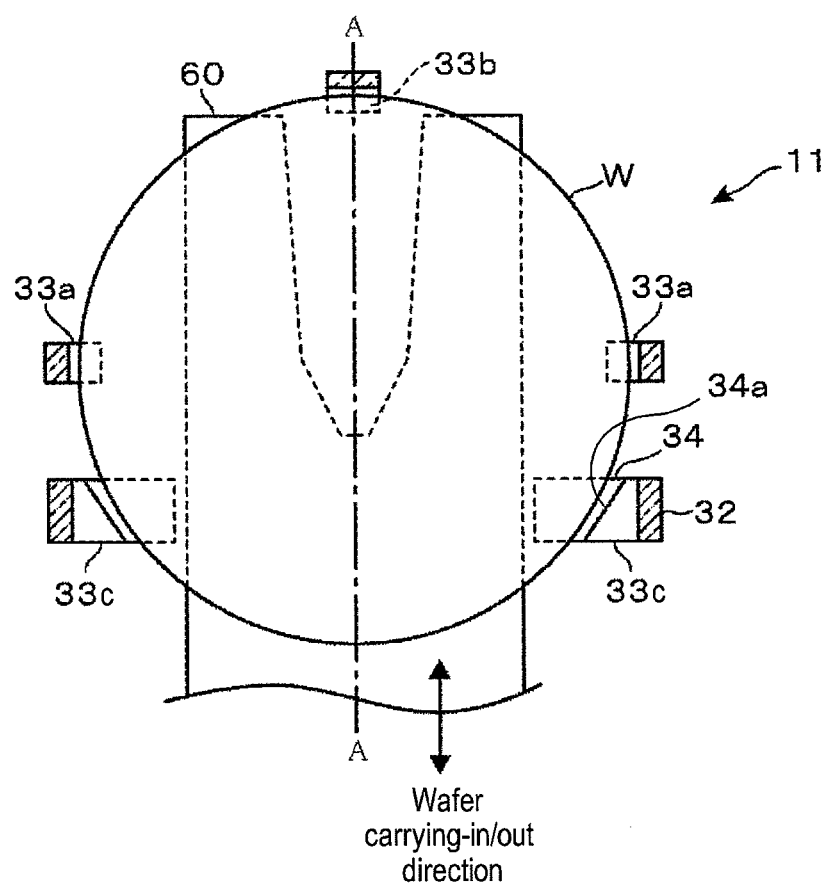
FIG. 5 is a cross-cut plan view of a substrate supporter of the vertical heat treatment apparatus.
Figure 6:
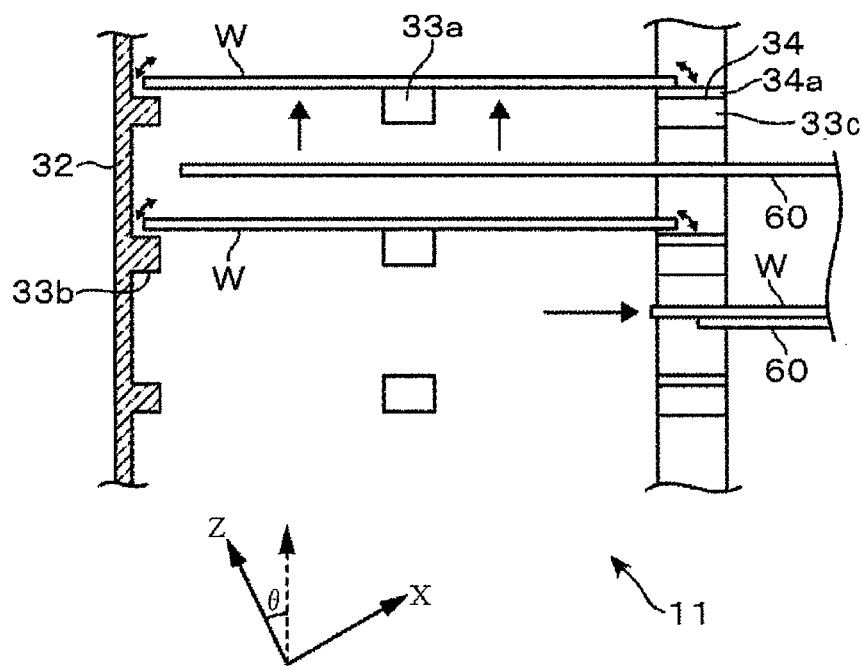
FIG. 6 is a partially-enlarged longitudinal sectional view of the substrate supporter.

Subsequently, the wafer boat 11 will be described in more detail. The wafer boat 11 is configured such that the periphery of the wafer W is vertically moved (i.e., the wafer W is rocked) to change a position of the wafer W every rotation of the wafer boat 11 around the inclination axis through the shaft 28, that is, to incline the wafer W with respect to the wafer boat 11 and then return it to its original position after one rotation. More specifically, as shown in FIGS. 4 to 6, the wafer boat 11 includes a plurality of (for example, five) supporting columns 32 which are separated from and in parallel to each other in the circumferential direction of the periphery of the wafer W, and plate-like holders 33 extending vertically from respective supporting columns 32 toward a reception region of the wafer W. The holders 33 are stacked up to, for example, 100 to 150 steps every height position at which the wafer W is received in the wafer boat 11. That is, five holders 33 are provided for each step since they support the periphery of the wafer W from its bottom side. In the wafer boat 11, a pitch between wafers W arranged in the form of a shelf (a distance between the top of one holder 33 and the top of an adjacent facing holder 33 over the one holder 33) is, for example, 10.5 mm or so. In addition, the height at which each wafer W is received (a distance between the top of one holder 33 and the bottom of an adjacent facing holder 33 over the one holder 33) is, for example, 6.5 mm or so.

As shown in FIG. 6, the height position of the tops of three of five holders 33 is lower by, for example, 0.1 cm than that of the tops of the remaining holders 33 in the direction of the inclination axis. When the higher holders 33 and the lower holders 33 are called "main holders 33a" and "auxiliary holders 33b and 33c," respectively, two main holders 33a are placed to face with each other through the center of the wafer W in the embodiment as shown in FIGS. 5 and 6. The main holders 33a are arranged to laterally support the approximate center of the wafer W in the movement direction of the carrying arm 60, and their separation dimensions are set to prevent them from interfering with the movement and elevation operation of the carrying arm 60. FIG. 6 shows a longitudinal sectional view of the wafer boat 11, taken along line A-A in FIG. 5.

One auxiliary holder 33b is placed at an inner side of the main holders 33a (in a direction in which the carrying arm 60 advances to the wafer boat 11) and two auxiliary holders 33c are arranged at an outer side of the main holders 33a (in a direction in which the carrying arm 60 retreats from the wafer boat 11) such that the advance and retreat region of the carrying arm 60 is inserted from both left and right sides. For the three auxiliary holders 33b and 33c, when the auxiliary holder 33b at the inner side of the main holders 33a is called "first auxiliary holder 33b" and the two auxiliary holders 33c at the outer side of the main holders 33a are called "second auxiliary holders 33c," the wafer W on the wafer boat 11 alternates between a position supported by the first auxiliary holder 33b and the main holders 33a and a position supported by the second auxiliary holders 33c and the main holders 33a every rotation of the wafer boat 11, as will be described later.

As shown in FIGS. 4 and 5, the top of the second auxiliary holders 33c in the reception region of the wafer W forms a step 34, and a vertical plane 34a facing the peripheral plane of the wafer W in the step 34 is formed to approach the advance and retreat region of the carrying arm 60 from the inner side to the outer side, following the periphery of the wafer W. Accordingly, the wafer W is supported by the step 34 from the rear side while being regulated by the vertical plane 34a to prevent the wafer from dropping to the outer side. A separation distance between the main holders 33a and the second auxiliary holders 33c when the wafer boat 11 is viewed from the inclination axis direction is set to be, for example, 30 mm or so such that the second auxiliary holders 33c do not interfere with the carrying operation of the carrying arm 60 and the vertical plane 34a can regulate the position of the wafer W (i.e., an angle is formed between the carrying direction of the wafer W and the vertical plane 34a). FIG. 6 shows a state where the carrying arm 60 moves up the wafer W from the bottom side and a state where the carrying arm 60 retreats from the wafer boat 11 with the wafer W held by the carrying arm 60. Disc-like ceiling plate 37 and floor plate 38 are provided in the top and bottom of the wafer boat 11, respectively, as shown in FIG. 1, although not shown in FIG. 4 and so on.

Figure 7:
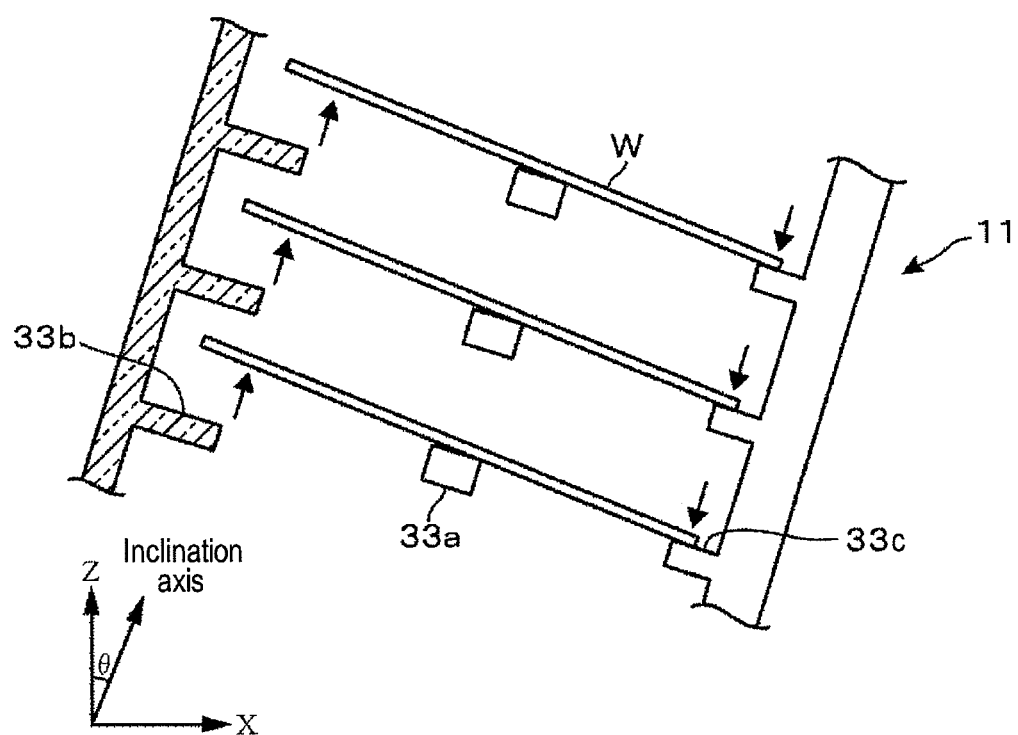
FIG. 7 is a longitudinal sectional view showing operation of the vertical heat treatment apparatus.
Figure 8:
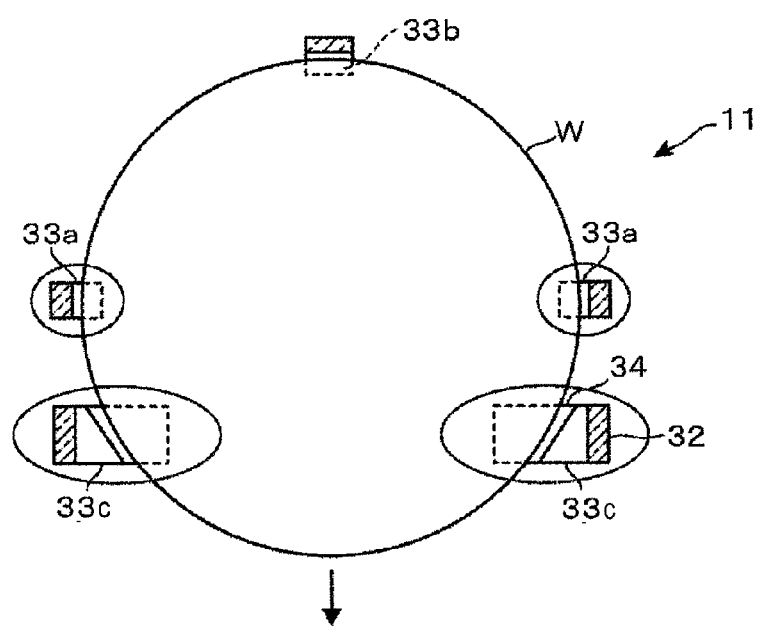
FIG. 8 is a cross-cut plan view showing operation of the vertical heat treatment apparatus.

Subsequently, the position of the wafer W when the wafer boat 11 is rotated around the inclination axis will be described in detail. As shown in FIGS. 7 and 8, for example, when the first auxiliary holder 33b is located above the main holders 33a and the second auxiliary holders 33c in the vertical axis direction, each wafer W in the wafer boat 11 is supported by the main holders 33a and the second auxiliary holders 33c, with the periphery of the wafer W floated from the first auxiliary holder 33b.

Figure 9:
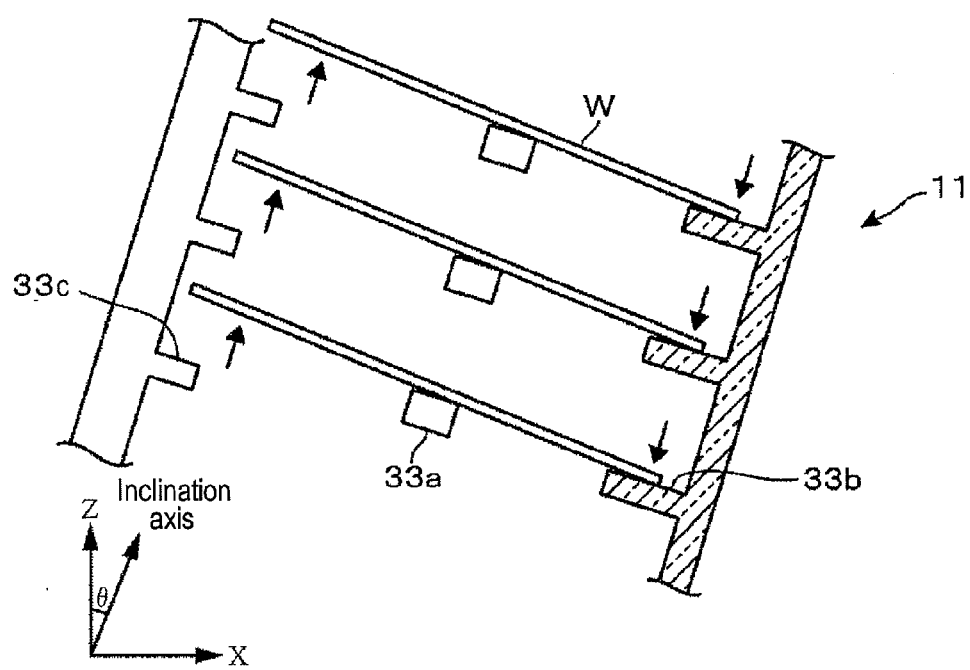
FIG. 9 is a longitudinal sectional view showing operation of the vertical heat treatment apparatus.
Figure 10:
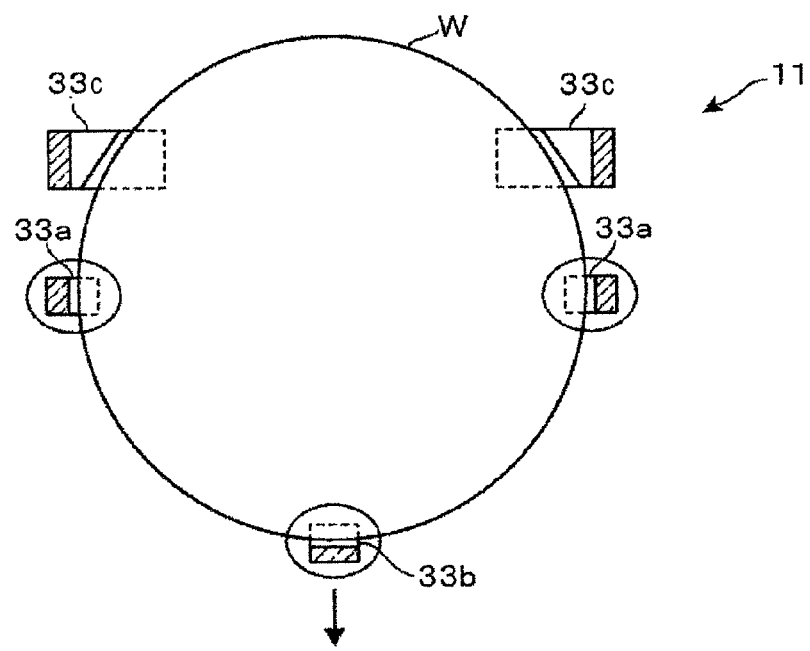
FIG. 10 is a cross-cut plan view showing operation of the vertical heat treatment apparatus.

Subsequently, when the wafer boat 11 is clockwise rotated to move the first auxiliary holder 33b toward the lower part of the reaction tube 12 in the vertical axis direction, as shown in FIGS. 9 and 10, the periphery of the wafer W at a position approaching the first auxiliary holder 33b gets inclined (retreated) to be supported by the first auxiliary holder 33b by gravity. Thus, the periphery of the wafer W supported by the second auxiliary holders 33c is lifted up and the wafer W is supported by the main holders 33a with its periphery floated from the first auxiliary holder 33b and the second auxiliary holders 33c.

That is, when the first auxiliary holder 33b is located toward the lower part of the reaction tube 12 in the vertical axis direction, the periphery of the wafer W contacts the first auxiliary holder 33b and each wafer W has a position to be supported by the first auxiliary holder 33b and the main holders 33a. Depending on the number of rotation of the wafer boat 11, an inclination angle θ of the wafer boat 11, layout of the main holders 33a and the auxiliary holders 33b and 33c, and so on, the periphery of each wafer W may contact the first auxiliary holder 33b directly after being separated from the second auxiliary holders 33c or may contact the first auxiliary holder 33b before the first auxiliary holder 33b reaches the lower part.

Subsequently, when the wafer boat 11 is rotated to move the first auxiliary holder 33b toward the upper part of the reaction tube 12 in the vertical axis direction, the periphery of the wafer W supported by the first auxiliary holder 33b is lifted up. Accordingly, likewise, each wafer W is supported by the main holders 33a with its periphery floated from the first auxiliary holder 33b and the second auxiliary holders 33c. Then, when the first auxiliary holder 33b reaches the upper part in the vertical axis direction, that is, when the wafer boat 11 is once rotated to return to the original position shown in FIGS. 7 and 8, the periphery of the wafer W floated from the second auxiliary holders 33c descends to be supported by the second auxiliary holders 33c and accordingly each wafer W returns to its original position. In this manner, each wafer W alternates between a position supported by the first auxiliary holder 33b and the main holders 33a and a position supported by the second auxiliary holders 33c and the main holders 33a. That is, it can be said that the first auxiliary holder 33b and the second auxiliary holders 33c support the wafer W alternately. In FIGS. 7 and 9, the inclination angle θ is schematically exaggerated. In FIGS. 8 and 10, the lower part of the reaction tube 12 in the vertical axis direction is indicated by an arrow and the holders 33 supporting (contacting) the wafer W is indicated by a circle.

In changing the position of the wafer W by rotation of the wafer boat 11, a contact portion at the rear side of the wafer W is changed between when the main holders 33a support the wafer W along with the first auxiliary holder 33b and when the main holders 33a support the wafer W along with the second auxiliary holders 33c. Specifically, when the wafer W is supported by the main holders 33a and the first auxiliary holder 33b, the main holders 33a support the wafer W using, for example, an end portion at the side of the first auxiliary holder 33b. When the wafer W is supported by the main holders 33a and the second auxiliary holders 33c, the main holder 33a support the wafer W using, for example, an end portion at the side of the second auxiliary holders 33c. Accordingly, a contact portion of the wafer W with the wafer boat 11 when the first auxiliary holder 33b is directed to the lower part of the reaction tube 12 in the vertical direction is different from a contact portion of the wafer W with the wafer boat 11 when the second auxiliary holders 33c is directed to the lower part in the vertical direction.

The gas injector 51 is made of, for example, quartz and, as shown in FIG. 1, is placed along the longitudinal direction of the inner tube 12b. On a side wall of the gas injector 51 is vertically formed a plurality of gas discharging holes 52 to face the wafer boat 11. The gas discharging holes 52 are arranged to correspond to respective height positions of wafers W received in the wafer boat 11. The gas injector 51 has one end inserted from the side wall of the flange unit 17 into the inner tube 12b and the other end connected to a gas reservoir 55 storing film-forming gas via a valve 53 and a flow rate regulator 54. As shown in FIG. 2, a plurality of (e.g., five) gas injectors 51 is horizontally arranged, with four connected to a $PH_3$ (phosphine) gas source 55a storing $PH_3$ gas and the remaining one connected to the $PH_3$ gas source 55a and a $SiH_4$ (monosilane) gas source 55b for feed of both of the $PH_3$ gas and $SiH_4$ gas.

The vertical heat treatment apparatus is provided with a control unit 70 such as a computer to control the entire operation of the apparatus. In a memory of the control unit 70 is stored a program to cause the apparatus to perform a film-forming process by feeding film-forming gas into the reaction tube 12 while rotating the wafer boat 11 around the inclination axis in the reaction tube 12. The program is installed in the control unit 70 from a storage such as a hard disk, compact disk, magneto-optical disk, memory card, flexible disk or the like.

Next, operation of the above-described embodiment will be described. First, an empty wafer boat 11 is descended to the lower part of the reaction tube 12, the carrying arm 60 is inclined such that the pick 62 of the carrying arm 60 is in parallel to each wafer W on the wafer boat 11, and a plurality of (e.g., 150) wafers W is loaded in the form of a shelf on respective holders 33 by means of the carrying arm 60. Specifically, the carrying arm 60 holding a wafer W advances in the wafer boat 11 such that the wafer W is located in an internal region of five holders 33 at a position slightly higher than the top of the main holders 33a in the inclination axis direction, and then, the carrying arm 60 is descended to a position lower than the top of the five holders 33 and loads the wafers W onto the wafer boat 11. Thus, the wafers W are sequentially loaded while retreating the carrying arm 60. Subsequently, the wafer boat 11 is inserted in the reaction tube 12 and the bottom of the flange unit 17 contacts the top of the cover 25 in an air-tight manner.

Subsequently, while making the atmosphere of the reaction tube 12 to a vacuum state by means of the vacuum pump 24 and rotating the wafer boat 11 around the inclination axis at, for example, 0.1 rpm, the wafer W on the wafer boat 11 is heated to, for example, 530 degrees Celsius or so by means of the heater 13. Subsequently, while adjusting the internal pressure of the reaction tube 12 to a process pressure by means of the pressure regulator 23, film-forming gas including $PH_3$ gas and $SiH_4$ gas is fed from the gas injector 51 into the reaction tube 12 (the inner tube 12b). When the film-forming gas fed into the inner tube 12b contacts the surface of each wafer W, a polysilicon (polycrystalline Si) film containing (doped with) phosphorus (P) is formed on the surface. Then, gas including non-reacted film-forming gas and by-products generated by the film-forming process flows through a region between the inner tube 12b and the outer tube 12a via an opening at the top of the inner tube 12b.

At this time, since the wafer boat 11 is also heated by the heater 13, a polysilicon film may be formed on the surface of the wafer boat 11 and a contact portion between the wafer boat 11 and the wafer W, like the surface of the wafer W. However, since the position of the wafer W is changed every rotation of the wafer boat 11, as described above, the poly- silicon film is separated toward the wafer W and the wafer boat 11 with the contact portion as a boundary. That is, when each wafer W is stopped on the wafer boat 11 (when the wafer W is supported by the first auxiliary holder 33b/main holders 33a or the second auxiliary holders 33c/main holders 33a), even if the polysilicon film is to be formed on the wafer boat 11, a contact portion of the wafer W with the wafer boat 11 when the first auxiliary holder 33b is directed to the lower part of the reaction tube 12 in the vertical direction is different from a contact portion of the wafer W with the wafer boat 11 when the second auxiliary holders 33c is directed to the lower part in the vertical direction. This results in the prevention of film from being formed on the contact portion between the wafer boat 11 and the wafer W.

Figure 11:
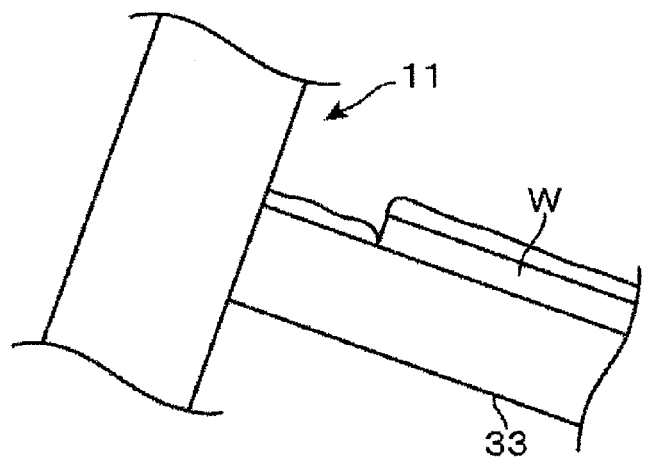
FIG. 11 is a partially-enlarged side view showing operation of the vertical heat treatment apparatus.

Thus, when the film-forming gas continues to be fed into the inner tube 12b while rotating the wafer boat 11, the polysilicon film is formed to be thick (for example, 1.0 μm) with the film prevented from being formed on the contact portion between the wafer W and the wafer boat 11, as shown in FIG. 11. Thereafter, the feed of the film-forming gas is stopped, the internal atmosphere of the reaction tube 12 is returned to the air atmosphere, and the wafer W is drawn out by means of the carrying arm 60 while descending the wafer boat 11. At this time, since no polysilicon film is formed on the contact portion, the wafer W is drawn out without being adhered to the wafer boat 11. Thereafter, while inserting the wafer boat 11 in the reaction tube 12 in an air-tight manner, for example, cleaning gas is fed from a gas source (not shown) into the reaction tube 12 to remove the polysilicon film adhered to the wafer boat 11.

Figure 12:
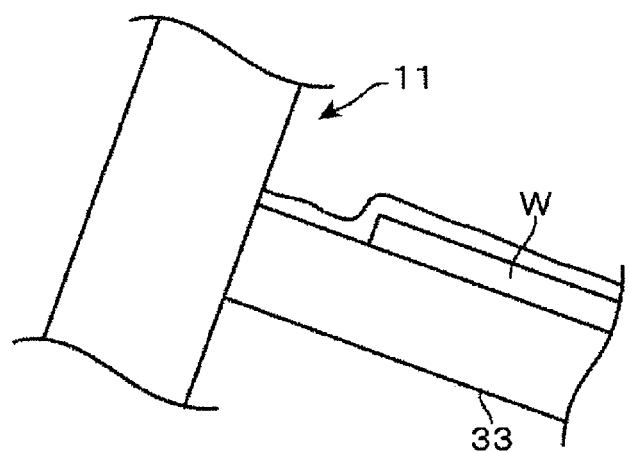
FIG. 12 is a side view showing a state where a conventional apparatus performs a film-forming process.

If the thick film is formed without rotating the wafer boat 11 in the film-forming process, the wafer W is adhered to the wafer boat 11 via the thick film formed on the contact portion, as shown in FIG. 12, which may make it impossible to draw the wafer W out of the wafer boat 11, or make the film formed on the contact portion drop out, which may result in generation of particles, or the film may be adhered to the rear side of the wafer W. FIGS. 11 and 12 show a portion of the polysilicon formed on the wafer W or the wafer boat 11.

According to the above-described embodiment, the wafer boat 11 can be rotated around the inclination axis inclined with respect to the vertical axis, and the wafer W can alternate between a position supported by the first auxiliary holder 33b and the main holders 33a and a position supported by the second auxiliary holders 33c and the main holders 33a every rotation of the wafer boat 11. In addition, since the film-forming gas is fed to form the film on the wafer W while rotating the wafer boat 11 in the reaction tube 12, it is possible to prevent the film from being formed on the contact portion between the wafer W and the main holders 33a or the auxiliary holders 33b and 33c and hence prevent the wafer W from being adhered to the wafer boat 11. In addition, since the film can be prevented from being formed on the contact portion, it is possible to prevent film from separation, which may result in the generation of particles, when the wafer W is drawn out of the wafer boat 11, or prevent the film from being adhered to the rear side of the wafer W, which may make it impossible to horizontally load the wafer W in a later lithographic (exposure) process, or further prevent the rear side of the wafer W from being scratched via the film. Thus, the thick film can be formed with the wafer W being prevented from being adhered to the wafer boat 11 or particles being prevented from being generated.

In addition, since there is no need to draw the wafer boat 11 out of the reaction tube 12 (which means a stop of the film-forming process) to change the position of the wafer W, it is possible to form the polysilicon film quickly.

In addition, since the supporting columns 32 and the steps 34 are arranged around the respective wafers W in inclining the wafer boat 11, the position of the wafers W can be regulated by the supporting columns 32 and the steps 34 even if the wafers W are to be slid downward across the wafer boat 11, which may result in preventing the wafer W from dropping from the wafer boat 11. When the thick film having a thickness of, for example, 0.2 μm or more is to be formed without rotating the wafer boat 11, since the wafer W is likely to be adhered to the wafer boat 11, the present invention may also be applied to form the thick film having a thickness of 0.2 μm or more in some embodiments.

In the above example, although the wafer W alternates twice between a position supported by the first auxiliary holder 33b and the main holders 33a and a position supported by the second auxiliary holders 33c and the main holders 33a every rotation of the wafer boat 11, the position of the wafer W may be changed three times every rotation of the wafer boat 11 with increase in the inclination angle θ. That is, when one of the second auxiliary holders 33c at the upstream in the rotation direction is located in the lower part of the reaction tube 12 of the vertical direction, the wafer W may be supported by the second auxiliary holder 33c and the main holders 33a. In such a case, when the two second auxiliary holders 33c reach the lower part of the vertical direction, the wafer W is supported by the second auxiliary holders 33c and the main holders 33a. Thereafter, when the second auxiliary holder 33c at the upstream in the rotation direction is directed to the upper part of the reaction tube 12 of the vertical direction, the wafer W is supported by the second auxiliary holder 33c at the downstream in the rotation direction and the main holders 33a. That is, the position of the wafer W may be changed at least three times during one rotation of the wafer boat 11.

Figure 13:
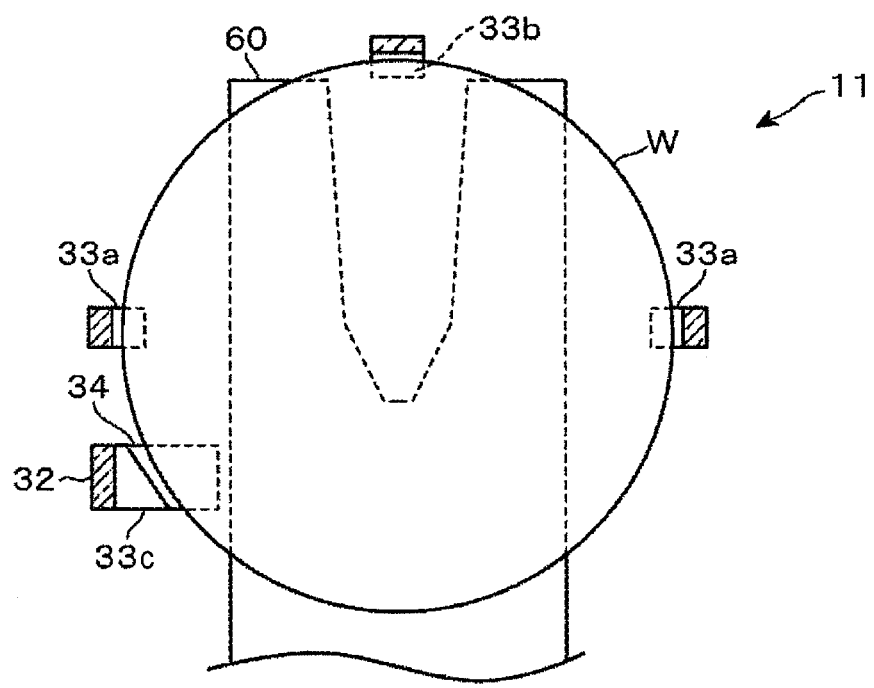
FIG. 13 is a cross-cut plan view showing another example of the vertical heat treatment apparatus.
Figure 14:
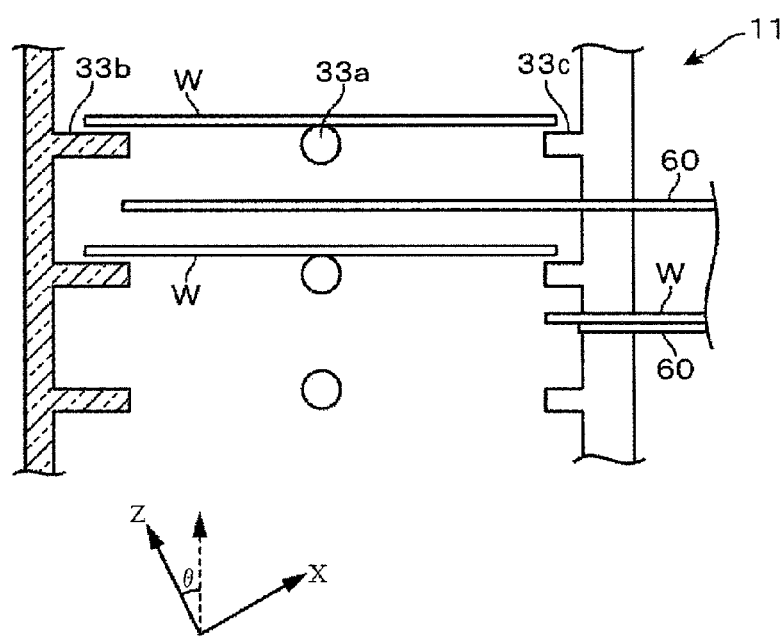
FIG. 14 is a longitudinal sectional view showing another example of the vertical heat treatment apparatus.

In addition, as shown in FIG. 13, one of the two second auxiliary holders 33c, for example, the second auxiliary holder 33c at the downstream in the rotation direction, may be eliminated. Even in such a case, the wafer W alternates between a position supported by the first auxiliary holder 33b and the main holders 33a and a position supported by the second auxiliary holder 33c and the main holders 33a every rotation of the wafer boat 11. In addition, although the holders 33 are plate-like, at least one of the five holders 33 may be substantially cylindrical and may be laterally arranged to support the wafer W on its circumference, as shown in FIG. 14. FIG. 14 shows one example of cylindrical main holders 33a, where the height position of the top of the main holders 33a is set as in the previous example. In such a case, since it is difficult for each wafer W to take a position supported by only the main holders 33a, the wafer W is quickly transferred between the first auxiliary holder 33b and the second auxiliary holders 33c. In addition, FIG. 14 schematically depicts the wafer boat 11 in which the second auxiliary holders 33c approaches the wafer W, which is equally applied to later FIGS. 15 and 16.

Figure 15:
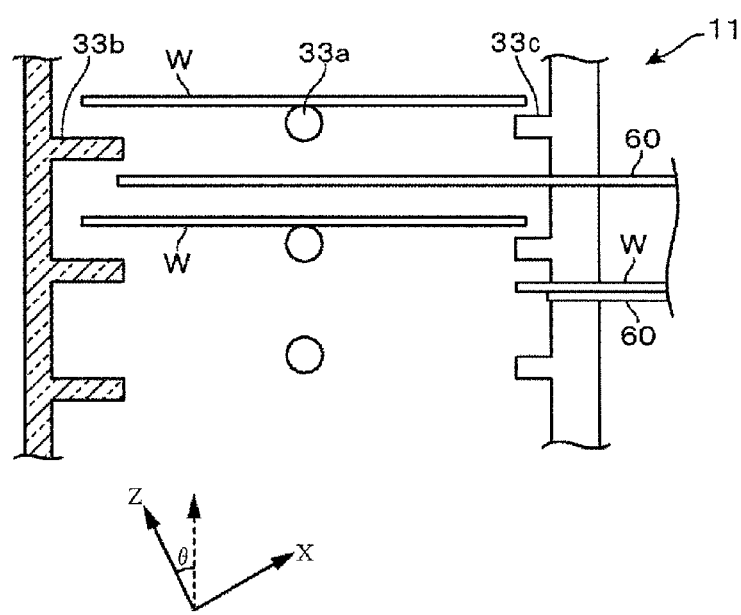
FIG. 15 is a longitudinal sectional view showing another example of the vertical heat treatment apparatus.

The height position of the tops of the first auxiliary holder 33b and the second auxiliary holders 33c may be interchanged in the inclination axis direction. FIG. 15 shows one example where the height position of the top of the second auxiliary holders 33c is higher than that of the top of the first auxiliary holder 33b in the inclination axis direction. In addition, the height positions of the main holders 33a may be interchanged with each other in the inclination axis direction.

Figure 16:
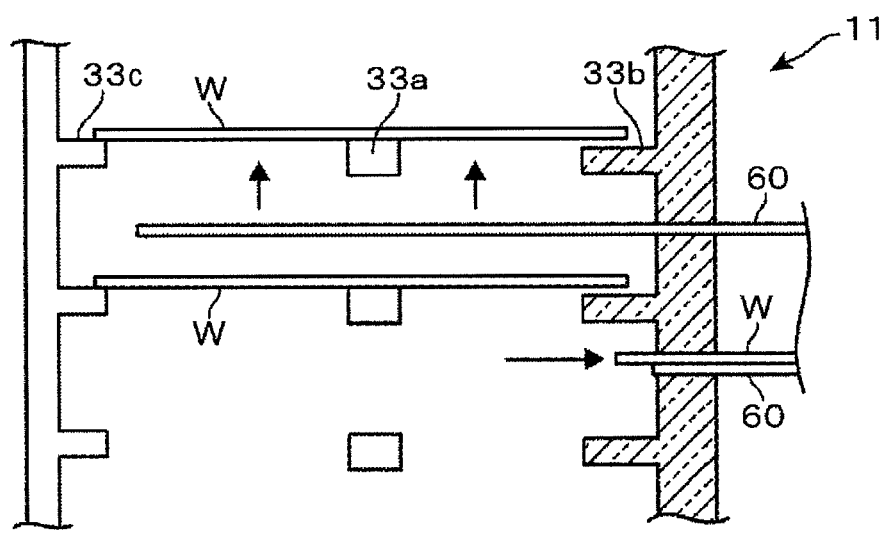
FIG. 16 is a longitudinal sectional view showing another example of the vertical heat treatment apparatus.
Figure 16:
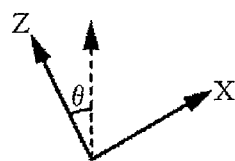

Further, as shown in FIG. 16, while the height position of the main holders 33a and the second auxiliary holders 33c are arranged in parallel in the inclination axis direction, the top of the first auxiliary holder 33b may be lower than the above height position. That is, the height position of at least one of the plurality of holders 33 (the first auxiliary holder 33b) may be lower than the height position of the other holders 33. In such a case, each wafer W alternates between a position supported by a plurality of the holders 33 (the main holders 33a and the second auxiliary holders 33c) and a position supported by, for example, two holders (the main holders 33a and the first auxiliary holder 33b).

Figure 17:
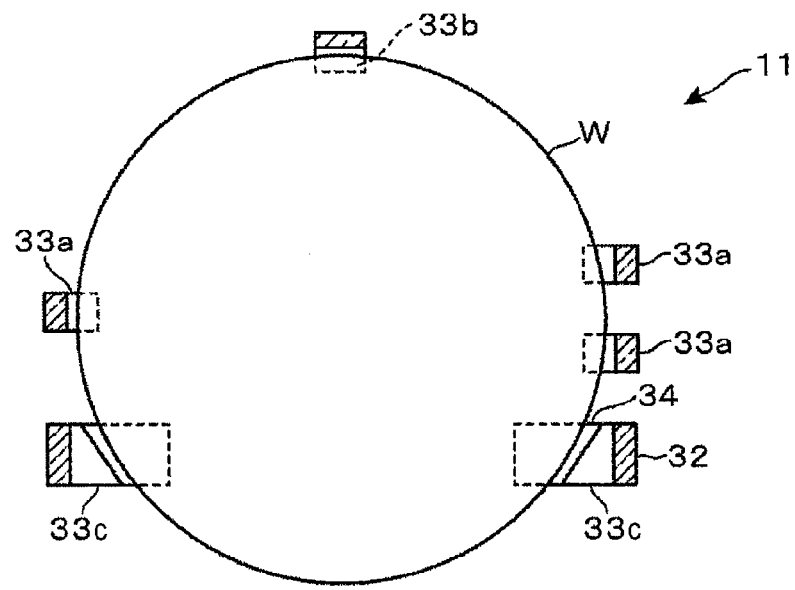
FIG. 17 is a plan view showing another example of the vertical heat treatment apparatus.
Figure 18:
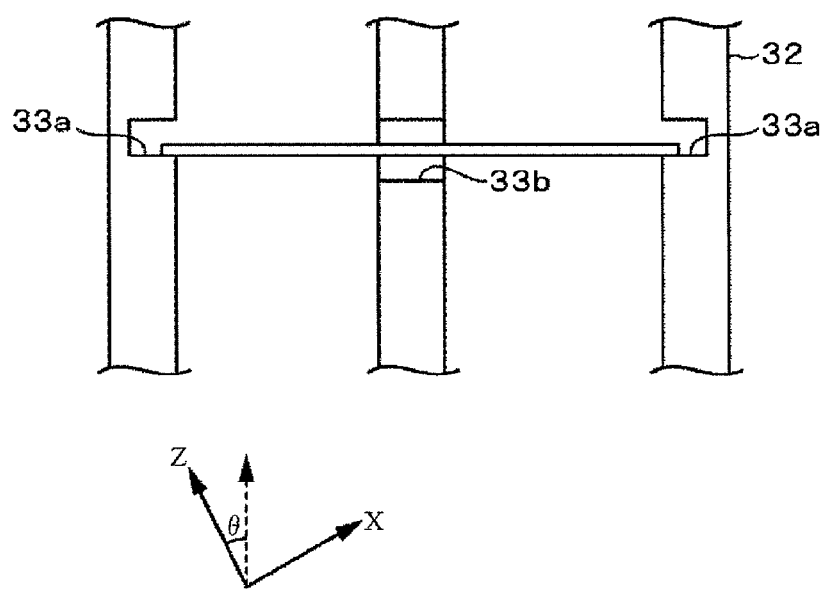
FIG. 18 is a longitudinal sectional view showing another example of the vertical heat treatment apparatus.

In addition, as a layout of the main holders 33a and the auxiliary holders 33b and 33c, some embodiments may employ a layout where at least one holder 33 is placed at both of the left and right sides when one of the two main holders 33a is viewed from the other, in which case at least one of the holders 33 becomes an auxiliary holder 33b or 33c. In addition, although the two main holders 33a are arranged to face each other through the center of the wafer W in FIG. 1, the two main holders 33a may be arranged to be separated horizontally from each other when the center of the wafer W is viewed from the one on the left side of the two main holders 33a, as shown in FIG. 17.

In addition, projecting pins (not shown) may be formed on the top of a leading end extending from each holder 33 toward the center of the wafer W and the wafer W may be supported by the pins from its rear side. In such a case, the wafer W is supported at an inner side by, for example, 5 cm or so than its periphery, even in the case the wafer W is supported by its "periphery" as mentioned herein.

In addition, although it is shown that the wafer boat 11 includes the supporting columns 32 and the holders 33 extending vertically from the supporting columns 32, a plurality of slit-like grooves may be formed in sides of the supporting columns 32 and the periphery of the wafer W may be supported by the grooves from the lower part of the reaction tube 12. In such a case, the supporting columns 32 are arranged outside the carrying region of the carrying arm 60 so that the wafer W can be carried in/out of the wafer boat 11. In addition, the reaction tube 12 may be configured such that the exhaustion holes 21 are formed on the ceiling of the reaction tube 12 and the reaction tube 12 is exhausted from the ceiling while introducing the film-forming gas from the lower part. In addition, the gas injector 51 and the reaction tube 12 may be inclined along with the wafer boat 11.

In some embodiments, the above-mentioned inclination angle θ is, for example, 0.5° to 20° since the position of the wafer W is difficult to change if the inclination angle is too small (i.e., the wafer boat 11 stand excessively upright) and a footprint of the apparatus increases if the inclination angle is too large (i.e., the wafer boat 11 excessively lies down). In addition, in some embodiments, the speed of rotation of the wafer boat 11 is 0.01 to 10 rpm since a film tends to be formed on the contact portion if the rotation speed is too small and the position of the wafer W is difficult to change due to its inertia if the rotation speed is too large. In addition, in changing the position of the wafer W, in some embodiments, a difference between height positions of the tops of the main holders 33a and the auxiliary holders 33b and 33c is, for example, 0.1 mm to 5 mm in order to facilitate change in the position of the wafer W and to prevent the wafer W from sliding across the wafer boat 11. The number and layout of the main holders 33a and auxiliary holders 33b and 33c are adjusted in various ways depending on the inclination angle θ and the number of rotation of the wafer boat 11 so that the position of the wafer W can be changed every rotation of the wafer boat 11.

In addition, although it has been illustrated in the above examples that the polysilicon film containing P is formed using a chemical vapor deposition (CVD) process, the polysilicon film may contain boron (B) in place of or in addition to P or a polysilicon containing no P and B may be formed. In addition, as for a silicon oxide (SiO$_2$) film, a silicon nitride (SiN) film or a carbon film, a thick film having a thickness of, for example, 3000 Å (300 nm) or so may be formed. In such a case, examples of film-forming gas to be used include silane gas and ozone gas for the SiO$_2$ film, silane gas and ammonia gas for the silicon nitride (SiN) film, and organic gas including carbon for the carbon film.

In addition, in forming a thick film using the apparatus of the present disclosure, the thick film may be applied to a 3D memory using a multilayered stack structure represented by bit-cost scalable (BICS) flash technology, terabit cell array transistor (TCAT) technology or the like. Examples of such a stack structure may include a stack structure having a plurality of (e.g., twenty-four) layers, each including a polysilicon film having a thickness of, for example, 500 Å (50 nm) and a silicon oxide film having a thickness of, for example, 500 Å formed thereon; a stack structure having a plurality of (e.g., twenty-four) layers, each including a silicon oxide film having a thickness of, for example, 500 Å and a silicon nitride film having a thickness of, for example, 500 Å formed thereon; and further a stack structure having a plurality of (e.g., twenty-four) layers, each including a silicon film having a thickness of, for example, 500 Å and a silicon germanium (SiGe) film having a thickness of, for example, 500 Å formed thereon. Examples of film-forming gas used to form the silicon germanium film may include silane gas and monogermane (Si$_4$Ge) gas. In addition, the present disclosure may be applied to, for example, formation of a silicon oxide film using an atomic layer deposition (ALD) process of absorbing process gas of atomic layers or molecular layers onto the surface of the wafer W and subsequently oxidizing the process gas to generate reaction products, instead of the CVD process.

Figure 19:
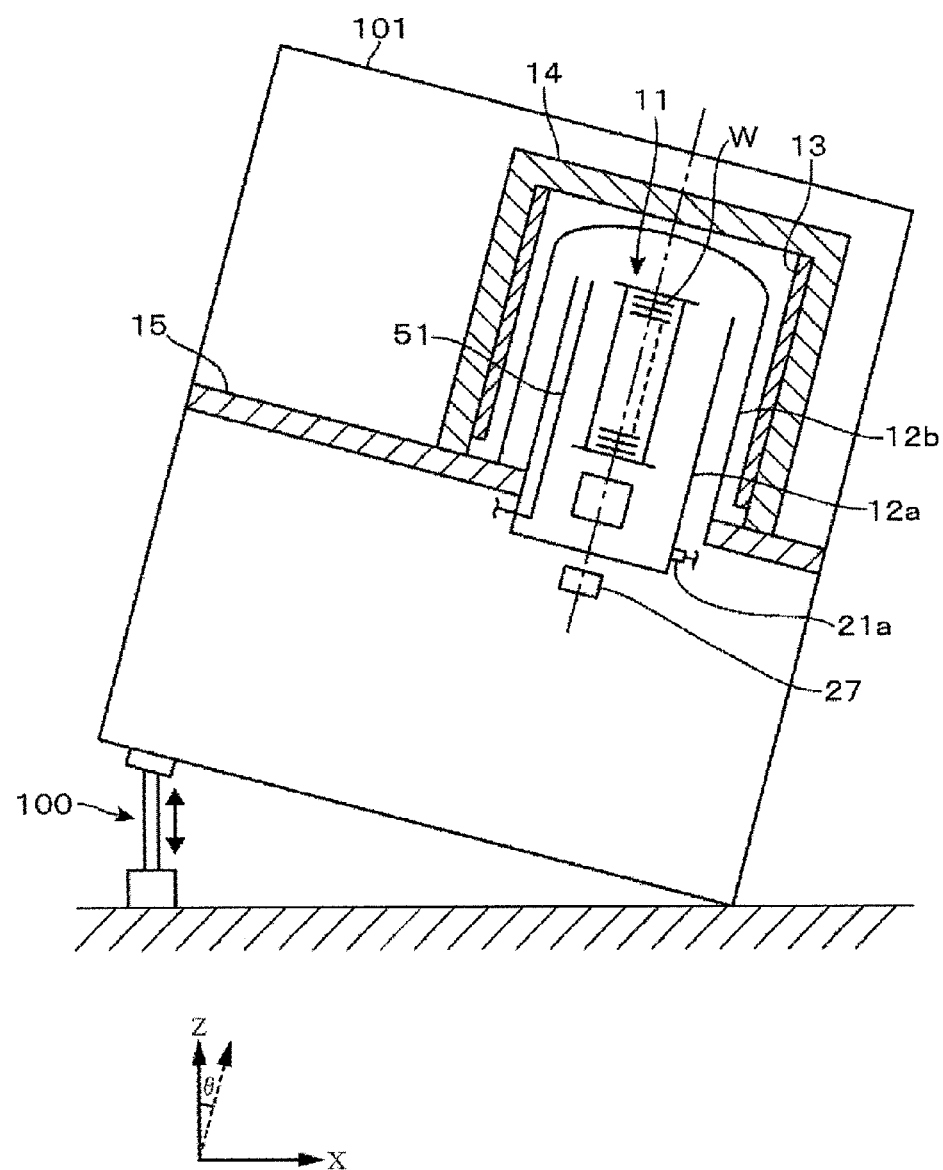
FIG. 19 is a longitudinal sectional view showing another example of the vertical heat treatment apparatus.

In addition, although it has been illustrated in the above that the shaft 28 is inclined with respect to the reaction tube 12 in rotating the wafer boat 11 around the inclination axis, the shaft 28 may be arranged along the longitudinal direction of the reaction tube 12, that is, the reaction tube 12 and the wafer boat 11 may be arranged to extend in the vertical direction, and the reaction tube 12 and the wafer boat 11 may be inclined together. FIG. 19 shows an example where an elevation mechanism 100 whose top can be elevated by means of a jack or the like is provided in the lower part of the bottom of a housing 101 forming a casing of the vertical heat treatment apparatus so that one end of the bottom of the housing 101 can be lifted from the lower part. Then, the wafer boat 11 is rotated around the inclination axis by means of the rotation mechanism 27.

According to the present disclosure, the substrate supporter supporting a plurality of substrates in the form of a shelf can be rotated around an inclination axis inclined with respect to the vertical axis and the position of each substrate is changed every rotation of the substrate supporter. In addition, since a film is formed on the substrate by feeding film forming gas into the reaction tube while rotating the substrate supporter, it is possible to prevent a film from being formed on the contact portion between the substrate and the substrate supporter and hence prevent generation of particles and adhesion of the substrate to the substrate supporter.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A vertical heat treatment apparatus which carries a substrate supporter supporting a plurality of substrates in the form of a shelf via supporting columns into a vertical reaction tube having a heater arranged around the vertical reaction tube and performs a film forming process for the substrates, comprising:
   a rotation mechanism which rotates the substrate supporter around an inclination axis inclined with respect to a vertical axis;
   a carrying arm which advances and retreats to load or unload the substrates onto or from the substrate supporter;
   a plurality of main holders which are provided at every reception position of the substrates in the substrate supporter and supports bottom peripheries of the substrates at positions separated from each other in a circumferential direction of the substrates; and
   at least one first auxiliary holder and at least one second auxiliary holder which are located to be separated from the main holders in the circumferential direction of the substrates and whose tops are lower than those of the plurality of main holders in a direction of the inclination axis,
   wherein the main holders are arranged to support a center portion of the substrates, the center portion configured equidistant from every point on the substrate between the first auxiliary holder and the second auxiliary holder, in a movement direction of the carrying arm and the first auxiliary holder and the second auxiliary holder are arranged at an advancing side and at a retreating side of the carrying arm with respect to the main holders, respectively, so that each of the substrates on the substrate supporter alternates between a position supported by the first auxiliary holder and the main holders and a position supported by the second auxiliary holder and the main holders every rotation of the substrate by means of the rotation mechanism.

2. The vertical heat treatment apparatus of claim 1, further comprising a control unit configured to output a control signal to cause the apparatus to perform a film forming process for the substrates by feeding film forming gas into the reaction tube while rotating the substrate supporter around the inclination axis.

3. The vertical heat treatment apparatus of claim 2, wherein the control unit is configured to output the control signal to cause a thickness of a film formed on each of the substrates to be equal to or greater than 0.2 μm.

* * * * *